United States Patent [19]

Itaya et al.

[11] Patent Number: 4,710,702
[45] Date of Patent: Dec. 1, 1987

[54] HETERODYNE TYPE SIGNAL-MEASURING METHOD AND A MEASURING APPARATUS INCLUDING AUTOMATIC DETUNING CORRECTION MEANS

[75] Inventors: Hiroshi Itaya, Isehara; Goro Saito, Aikawamachi, both of Japan

[73] Assignee: Anritsu Corporation, Tokyo, Japan

[21] Appl. No.: 2,692

[22] PCT Filed: Apr. 14, 1986

[86] PCT No.: PCT/JP86/00183

§ 371 Date: Dec. 10, 1986

§ 102(e) Date: Dec. 10, 1986

[87] PCT Pub. No.: WO86/06174

PCT Pub. Date: Oct. 23, 1986

[30] Foreign Application Priority Data

Apr. 13, 1985 [JP] Japan .................................. 60-78755
Apr. 13, 1985 [JP] Japan .................................. 60-78756

[51] Int. Cl.[4] ......................................... G01R 23/14
[52] U.S. Cl. .................................... 324/79 R; 328/137
[58] Field of Search ................ 324/79 R, 79 D, 78 R, 324/78 D, 77 R, 77 B, 77 D, 77 E, 83 R; 328/141, 140, 137

[56] References Cited

U.S. PATENT DOCUMENTS

| | | | |
|---|---|---|---|
| 3,968,719 | 7/1976 | Sanderson | 324/79 R |
| 3,977,002 | 8/1976 | Barton | 324/79 R |
| 3,978,403 | 8/1976 | Mansfield | 324/79 R |
| 4,005,364 | 1/1977 | Harrington | 324/79 D |
| 4,414,504 | 11/1983 | Kennedy | 324/79 R |
| 4,672,308 | 6/1987 | Leikus | 324/79 R |

*Primary Examiner*—Michael J. Tokar
*Attorney, Agent, or Firm*—Frishauf, Holtz, Goodman & Woodward

[57] ABSTRACT

A signal-measuring apparatus for measuring a level of a signal to be measured includes a reference signal oscillator, a variable local signal oscillator, a heterodyne type mixer, a bandpass filter and automatic detuning correction means. In the automatic detuning correction means, there are provided a peak value memory, a tracking circuit and a detuning-correction calculating circuit. When a filter output is obtained by passing the reference signal through the bandpass filter, a peak value is acquired by varying the oscillator frequency of the local signal. This peak value is stored in the peak value memory. Then, the signal to be measured is supplied to the bandpass filter to acquire another filter output. This filter output is calculated in the detuning correction calculating circuit based upon the above-described peak value as a reference value so as to correct the error caused by the filter detuning.

23 Claims, 14 Drawing Figures

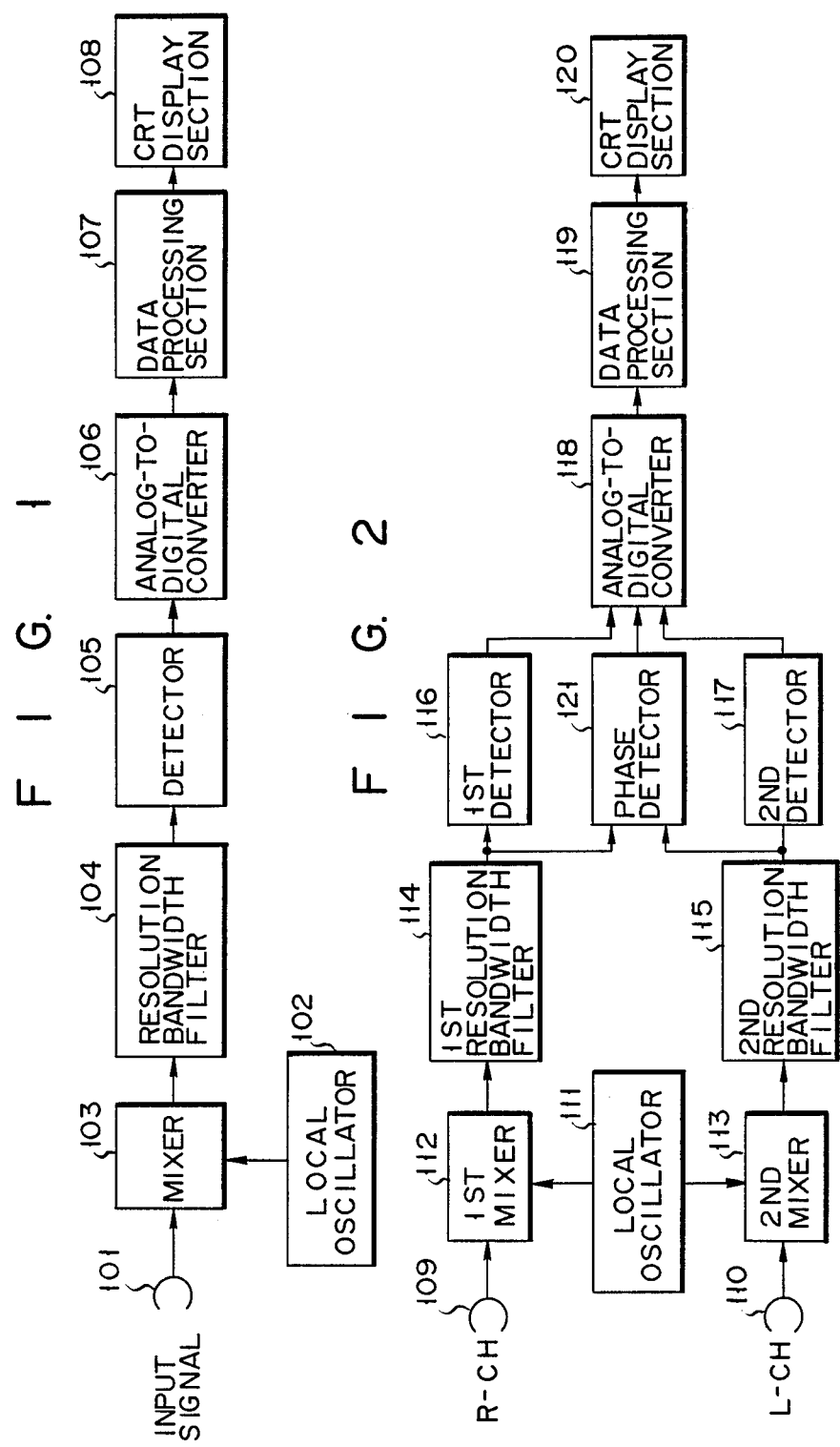

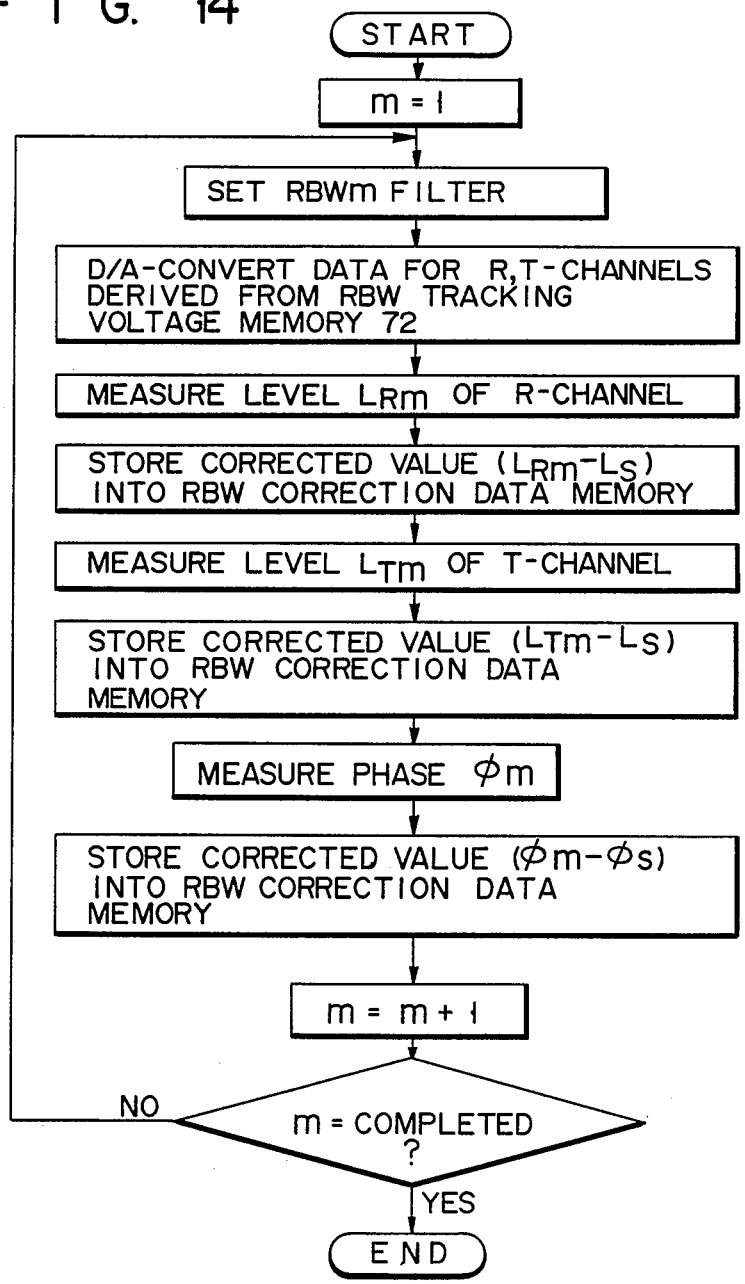

HETERODYNE TYPE SIGNAL-MEASURING METHOD AND A MEASURING APPARATUS INCLUDING AUTOMATIC DETUNING CORRECTION MEANS

FIELD OF THE INVENTION

The present invention relates to a method of automatically correcting, within an internal circuit of a signal measuring apparatus, a detuning phenomenon caused by electronic characteristic changes in a resolution bandwidth filter employed in a heterodyne type signal-measuring apparatus, and of measuring a phase difference between signals to be measured after the detuning correction is completed, and furthermore relates to an apparatus for performing such measurements.

TECHNICAL BACKGROUND

In general, various types of signal-measuring apparatus have been developed to measure various characteristics of electronic signals, for instance, selection level meters, spectrum analyzers, network analyzers and the like.

FIG. 1 shows a typical arrangement of a conventional selection level meter employing a heterodyne system.

A basic operation of the heterodyne type selection level meter is as follows.

An input signal to be measured, which is supplied from an input terminal 101, is mixed in a mixer 103 with an oscillator output signal of a local oscillator 102, provided within the measuring apparatus. An intermediate signal (referred to as an "IF signal") is output from mixer 103. That is to say, the heterodyneconverted intermediate signal is bandwidth-limited by a resolution bandwidth filter 104 and furthermore detected by a detector 105. The detected signal is converted into a digital signal by an analog-to-digital converter 106, signal-processed in a data processing section 107, and thereafter displayed on a CRT display section 108.

FIG. 2 shows a typical arrangement of a conventional network/spectrum analyzer employing a heterodyne system. An operation of the network/spectrum analyzer will now be summarized.

The network/spectrum analyzer includes an R (reference signal) channel input terminal 109 and a T (test signal) channel input terminal 110. The input signals to be measured which are input from these two channel terminals are input to corresponding first and second mixers 112 and 113. These input signals are mixed with oscillator output signals of a common internal local oscillator 111 in these mixers 112 and 113. That is to say, the heterodyne conversion is performed in mixers 112 and 113. The outputs of mixers 112 and 113 are bandwidth-limited by first and second resolution bandwidth filters 114 and 115, and then detected in first and second detectors 116 and 117. The outputs of first and second detectors 116 and 117 are converted into digital signals in an analog-to-digital converter 118, and furthermore signal-processed in a data processing section 119, and finally displayed on an CRT display device 120. When measuring the phase difference between both input signals, the input signals in both the signal channels are first filtered in resolution bandwidth filters 114 and 115 and then supplied to phase detector 121 to obtain the phase difference between these input signals as an analog voltage. This analog voltage is converted into a digital signal by analog- to-digital converter 118. After the digital signal is processed in data processing section 119, it is displayed on CRT display device 120.

These prior art signal-measuring apparatus has a drawback, however, in that, as shown in FIG. 3, a filtering center frequency ($F_1$) of the resolution bandwidth filter is varied due to the temperature drift of this filter and the aging effects. That is to say, a detuning phenomenon occurs in the conventional apparatus. As illustrated in FIG. 3, the filter characteristic of the resolution bandwidth filter is, in general, influenced by the temperature drift and/or aging effects.

In other words, errors of ($F_2-F_1$) and ($L_2-L_1$) exist in the peak (center) frequencies and the signal levels, respectively, under the condition that the characteristic curve $G_1$ represents the normal filter condition and the characteristic curve $G_2$ indicates the detuned filter condition.

To correct these errors in the conventional apparatus, an oscillator (not shown) having stable and synthesized oscillating frequencies and stable output signal level is prepared in addition to the conventional measuring apparatus. For example, the oscillator is driven in such a manner that the frequency produced by local oscillator 102 of the measuring apparatus shown in FIG. 1 is swept to measure the detuning curve $G_3$ as represented in FIG. 4. Thereafter, the filter output level "$L_3$" at a predetermined frequency "$F_3$" in the curve "$G_3$" is read, and a difference ($L_3-L_0$) between this level "$L_3$" and a preset level "$L_0$" of the synthesized oscillator is obtained as a correction value. Thus, the error ($L_3-L_0$) caused by the detuning is corrected by utilizing this correction value according to the conventional correcting method.

In accordance with such a conventional detuning correcting method, an external reference signal source must be employed and complex calibration steps are also required.

Moreover, as can easily be understood from the detuning curve $G_3$ of FIG. 4, the calibration data is obtained at a given point on the left slope of the curve $G_3$, not at a peak point thereof, so that stability of the corrected level data is still impaired because of the detuning phenomenon.

In addition, the serious drawback of a level shift may occur, which is caused by not only the resolution bandwidth filter, but also the circuit elements other than the bandwidth filter, with the result that the errors cannot be compensated for when determining the measuring results.

When the phase difference characteristic between two input signals is measured in the circuit arrangement of the conventional network/spectrum analyzer shown in FIG. 2, another error may be contained in the measurement result of the phase difference characteristic, since first and second resolution bandwidth filters 114 and 115 in the respective signal processing channels are detuned.

DISCLOSURE OF THE INVENTION

An object of the invention is to provide a heterodyne type signal-measuring apparatus and a measuring method, wherein the detuning phenomenon of the resolution bandwidth filter, caused by temperature drift and the like, is automatically corrected by automatic detuning correction means provided within the measuring apparatus.

Another object of the invention is to provide a heterodyne type signal-measuring apparatus and a measuring method, where in the heterodyne type signal-measuring apparatus for automatically correcting the detuning phenomenon of the resolution bandwidth filters by means of the automatic detuning correction means provided therein, a measuring error contained in a phase difference between a plurality of input signals is corrected while the tuning frequencies of the resolution bandwidth filters are maintained at predetermined frequencies.

The above-described object and the other object of the present invention may be accomplished by providing the heterodyne type signal measuring apparatus described below.

A heterodyne type signal-measuring apparatus having automatic detuning correction means according to the invention is characterized by comprising:

means for generating a reference signal having a reference frequency and a predetermined signal level;

means for generating a variable frequency signal whose oscillating frequency is varied within a given range;

means for producing a signal having an intermediate frequency by receiving either the reference signal, or a signal to be measured so as to be heterodyne-mixed with said variable frequency signal;

means for resolution-bandwidth-filtering said intermediate frequency signal;

means for acquiring a peak level value from the output of said resolution-bandwidth-filtering means upon receipt of said reference signal while the frequency of said variable frequency signal is varied;

tracking means for making a tuning frequency of said filtering means coincident with said intermediate frequency based upon said peak level value; and means for calculating the level of the input signal which has been filtered when said input signal to be measured is received, so as to correct a level error caused by the detuning, based upon said peak level value, whereby the level of said input signal can be measured under the correct level by correcting the detuning error occurring in said filtering means when the level of said input signal is measured.

Moreover, a heterodyne type signal-measuring apparatus according to the invention is characterized by comprising:

a heterodyne type signal-measuring apparatus, wherein at least a first signal processing channel for processing a first measured signal as a reference signal, and a second signal processing channel for processing a second measured signal having a phase difference to be measured are provided to measure the phase difference between said first and second signals, said signal-measuring apparatus comprising:

means for generating a reference signal having a reference frequency and a predetermined signal level;

means for generating a variable frequency signal whose oscillating frequency is varied within a given range;

means for producing signals having first and second intermediate frequencies by receiving either the first signal or the second signal, so as to be heterodyne-mixed with said variable frequency signal;

means for resolution-bandwidth-filtering the first intermediate frequency;

means for resolution-bandwidth-filtering the second intermediate frequency;

means for acquiring first and second peak level values in said first and second bandwidth-filtering means upon receipt of said reference signal while the frequency of said variable frequency signal is varied;

means for correcting the detuning occurring in said first and second filtering means based upon said first and second peak level values;

means for detecting a phase difference between the reference signals passing through said first and second filtering means when said reference signal is received and said first and second peak level values are obtained;

means for storing said phase difference in the detecting means as a reference phase difference; and means for phase-correcting a phase difference between said first and second signals which have passed through said first and second filtering means, based upon said reference phase difference, upon receipt of said first and second signals, whereby said phase difference between said first and second signals to be measured can be automatically corrected.

BRIEF DESCRIPTION OF THE DRAWINGS

FIG. 1 is a block diagram showing an arrangement of a heterodyne type signal-measuring apparatus according to a conventional and typical measuring apparatus;

FIG. 2 is a block diagram illustrating an arrangement of a heterodyne type network/spectrum analyzer according to a prior art and typical measuring apparatus;

FIGS. 13 and 14 are flowcharts for describing typical operations by the analyzer shown in FIG. 12.

BEST MODE OF THE INVENTION

Basic Operation Modes of Detuning Correction

Before proceeding with various types of preferred embodiments of signal-measuring apparatus according to the invention, a basic operation of the signal-processing apparatus in the detuning correction mode will now be described with reference to FIG. 5.

Figure 5:
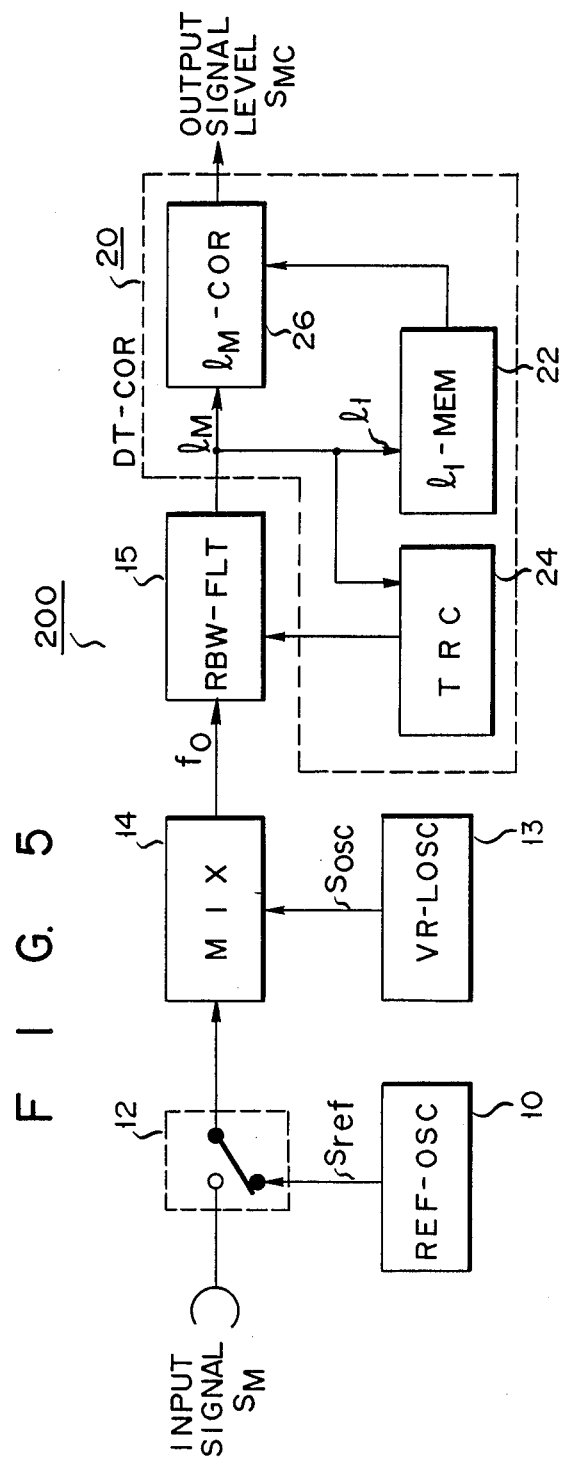
FIG. 5 is a block diagram of a basic arrangement of the signal measuring apparatus in the detuning correction mode according to the invention.

In a signal-measuring apparatus 200 including automatic detuning correction means as shown in FIG. 5, there are provided a reference signal oscillating unit (REF-OSC) 10 for producing a reference signal ($S_{ref}$) having a predetermined output signal level as a measurement basis and a predetermined oscillating frequency, and switching means for switching between the reference signal $S_{ref}$ derived from the reference signal oscillating unit 10 and a signal to be measured $S_M$. The signal measuring apparatus 200 further includes a mixer unit (MIX) 14 for converting the output signal derived from the switching means into an intermediate frequency $f_0$ by utilizing a local oscillating frequency $S_{osc}$ in the heterodyne method; a variable-tuning type resolution bandwidth filter (RBW-FLT) 15 for receiving the output of mixer unit 14 to be tuned to the intermediate frequency $f_0$; and a detuning correction unit 20 for automatically correcting the detuning of the output $l_M$ from the filter 15 by predetermined means.

Detuning correction unit 20, as illustrated in FIG. 5, is mainly constructed of a memory unit for a filter peak value ($l_1$-MEM) 22, a tracking unit (TRC) 24, and a detuning correction calculating unit ($l_M$-COR) 26. The memory unit for a filter peak value 22 has a function to store a peak value $l_1$ of the filter output when the resolution bandwidth filter 15 is tuned.

Tracking unit 24 has a function to make a coincidence between the tuning frequency of the filter 14 and the intermediate frequency $f_0$, so as to obtain the peak value "$l_1$" in the output level of the filter 15 when the reference signal $S_{ref}$ is supplied to the mixer unit 14, and the oscillating frequency of the local oscillating signal $S_{osc}$ is gradually changed (swept). Then, detuning-correction calculating unit 26 has a function to perform calculations for correcting the detuning conditions of the output of filter 15, to which the input signal to be measured $S_M$ has been input, based upon the peak value "$l_1$" of the filter which has been obtained by the reference signal $S_{ref}$ and stored.

The basic operation mode of the automatic detuning correction, as described above, will now be summarized.

First of all, peak value "$l_1$" of the filter output is acquired and stored prior to the signal level measurement of the input signal. That is to say, peak value "$l_1$" of resolution bandwidth filter 15 is acquired by driving reference signal oscillating unit 10 and sweep-type local oscillator unit 13, and by means of the tracking operations of tracking unit 24 in detuning correction means 20. This peak value is stored in memory unit 22 for a filter peak value in advance of the signal level measurement.

In the next level measurement, input signal to be measured ($S_M$) is heterodyne-converted to obtain filter output $l_M$ of resolution bandwidth filter 15. This filter output $l_M$ is corrected in detuning-correction calculating unit 26 by way of a predetermined correcting operation ($l_M$-$l_1$) to obtain a desirable (precise) detuning-corrected signal level $S_{MC}$ to be measured.

The detuning-corrected signal level to be measured is supplied to data processing means (not shown in detail) and further processed therein, if required.

It should be noted that the output level of reference signal oscillating unit 10 is preset to 0 dBm, or the like, which is appropriate for the signal measurement.

Figure 3:
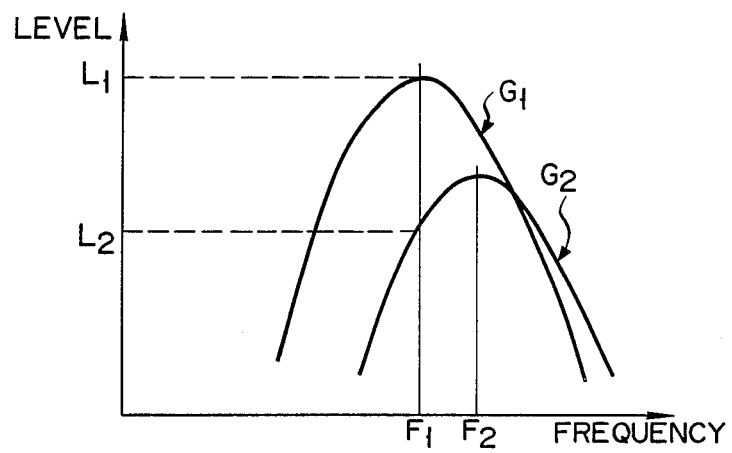
FIG. 3 is an illustration for explaining level setting operation by a resolution bandwidth filter.
Figure 4:
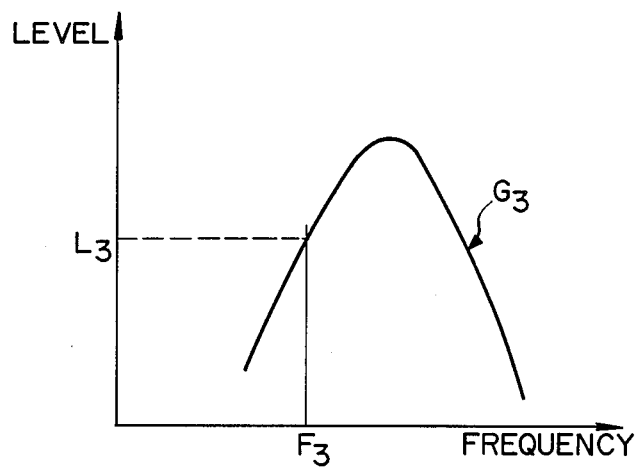
FIG. 4 is an illustration for explaining the tuning operation of the resolution bandwidth filter.

The functions of tracking unit 24 will now be summarized. A filter output curve "$G_2$", as illustrated in FIG. 3, is, for instance, provided from the swept signal of the local oscillator signal $S_{osc}$. In this case, it is assumed that an output peak value at $F_2$ is "$l_d$". Since such an output curve $G_2$ corresponds to an output curve when filter 15 is detuned, it needs to be returned to the tuned output curve $G_1$ shown in FIG. 3 (the output peak value thereof being "$l_1$"). This means that the frequency $F_2$ of the output peak level $l_1$ is recognized upon receipt of the output of filter 15 by tracking unit 24, and a difference between the original (i.e., formal tuning) frequency $F_1$ and the obtained frequency $F_2$. The tuning frequency of filter 15 is varied, based upon this difference. In other words, the center frequency $F_2$ of the curve $G_2$ in FIG. 3 is shifted to the position of the center frequency $F_1$ of the curve $G_1$. It should be noted that the function of the tracking unit is to shift the output curve $G_2$ of the filter, which is detuned due to temperature drift and the like, to the original resonance curve $G_1$ of the filter.

As is easily seen from the resonance curves $G_1$ and $G_2$, not only the center (tuning) frequencies shift, but also the levels change once the detuning occurs. Accordingly, if the center frequency is correctly shifted from "$F_2$" to "$F_1$" by the above-described tracking function, the desired object can be achieved, because the level correction can be done at the peak value of the filter after the tracking process is accomplished.

Basic Operation Mode of Phase Correction

A description will now be made of the signal-measuring apparatus operated in the phase correction mode with reference to FIG. 6.

It should be noted that the same reference numerals shown in FIG. 5 will be employed as those for denoting the same or similar circuit elements shown in the following figures.

A measuring apparatus 300 operated in the phase correction mode as shown in FIG. 5, includes at least two signal input channels (R-CH) and (T-CH). In these signal input channels (R-CH) and (T-CH), there are arranged switching means 12R and 12T, a reference signal oscillating unit (REF-OSC) 10, a variable (sweep) type local oscillator unit (VR-$L_{osc}$) 13, mixer units (R-MIX, L-MIX) 14R, 14T, and resolution bandwidth filters (R-RBW-FLT, T-RBW-FLT) 15R, 15T. These filters are broad bandwidth filters and have, for instance, a 3 dB-bandwidth of 10 KHz. An automatic detuning-correction unit (DT-COR) 30, for correcting the filter detuning based upon the output of these filters 15R and 15T, and an automatic detuning-correction unit (PH-COR) 40 for correcting a phase difference between both input signals $S_{M-R}$ and $S_{M-T}$, are coupled to the outputs of these filters 15R and 15T.

The function of automatic detuning-correction unit 30 is the substantially same function of the automatic detuning correction unit 20, but has the following different points. That is to say, although acquisition of the peak values ($l_1$-R, $l_1$-L) of the filter output signals by sweeping the frequency of the local oscillator signal $S_{osc}$ is the same as in the unit 20, these peak values are not stored in unit 30. The positions at which these peak values have been obtained, for example, the number, position (address) and the like of the sweeping step are obtained, and biasing voltages corresponding to these positions are then applied to an element, for instance, a variable capacitance diode for varying the center frequency of the respective filters 15R and 15T (will be discussed later). The tracking function for tuning the center frequencies of each filter 15R, 15T to the output intermediate frequencies of the mixer unit 14R, 14T is incorporated with this detuning-correction unit 30. In other words, the tuning curve $G_2$ is shifted to the curve $G_1$, as shown in FIG. 3, according to the tracking operation by correction unit 30.

Automatic phase-correction unit 40, on the other hand, includes phase detecting means 42, reference phase memory means 44 and phase-correction calculating means 46. To phase detecting means 42, the above-described filter outputs containing less detuning-errors are supplied, and the phase shift, or difference between these filter output signals is detected therein, and temporarily stored as a reference phase difference $\phi_{ref}$ in reference phase memory means 44. Thereafter, the signals to be measured ($S_{M-R}$ and $S_{M-T}$) are supplied to the respective input channels R-CH and T-CH, so as to be bandwidth-filtered in the respective filters 15R and 15T. A phase difference $\phi_M$ between filter outputs $l_{M-R}$ and $l_{M-T}$ is detected in phase detecting means 42. As previously described, the phase difference $\phi_M$ contains the phase errors. The phase errors are mainly caused by the temperature drift existing in both filters 15R and 15T. The phase difference $\phi_M$ between signals $S_{M-R}$ and $S_{M-T}$ measured the above way is calculated in phase-correction calculating means 46, based upon the reference phase difference $\phi_{ref}$ stored in advance, to obtain a desired (corrected) phase difference $\phi_{MC}$. The abovedescribed operation is the basic operation of the phase correction mode according to the invention.

Automatic Detuning-Correction Means

Figure 7:
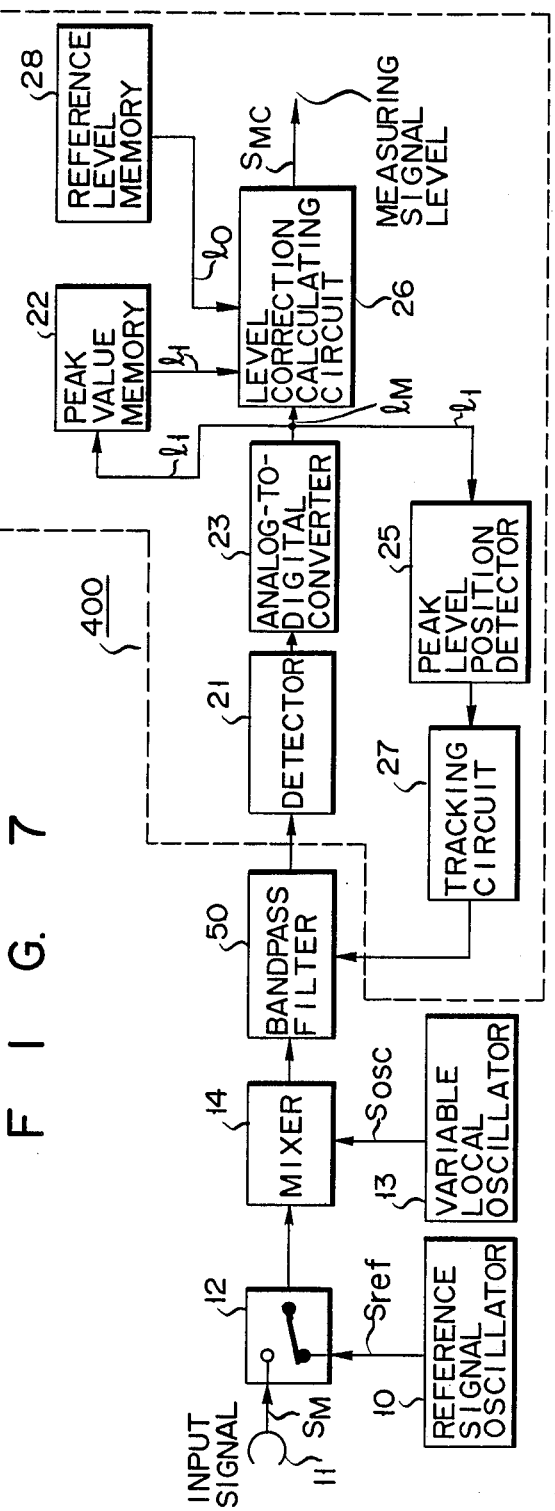
FIG. 7 is a detailed block diagram of the signal-measuring apparatus operated in the detuning correction mode of FIG. 5 according to one preferred embodiment.

Referring now to FIG. 7, a signal-measuring apparatus 400, including automatic detuning-correction means as a first operation mode according to the invention, will be described in detail. Signal-measuring apparatus 400 employs the principle of the basic detuning correction means as shown in FIG. 5. It is therefore noted that like reference numbers of FIG. 5 refer to like circuit elements in FIG. 7 and the operations thereof will be simply described.

Signal measuring apparatus 400, as illustrated in FIG. 7, includes: an input terminal 11, for receiving input signal $S_M$; a reference signal oscillator 10; input signal switching means 12; a variable local oscillator 13; a mixer 14; a bandpass filter 50; a peak-level position detector 25; a tracking circuit 27, a peak value memory 22, a level correction calculating circuit 26; analog-to-digital (A/D) converter 23; a reference level memory 28 and a detector 21. An output signal $S_{MC}$, corrected by correction calculating circuit 26, is derived therefrom.

An oscillator having high frequency resolution, e.g., a synthesizer-type oscillator, is utilized as variable local oscillator 13, whereas reference signal oscillator 10 is such an oscillator that it is operated in synchronism with variable local oscillator 13 so as to stabilize its oscillating frequency. The output signal level of reference signal oscillator 10 is stabilized by a temperature-compensated automatic gain-correction amplifier (not shown). An absolute value of the output signal from reference signal oscillator 10 is stored as a reference level "$l_0$" in reference level memory 28 (for instance, a memory arranged by ROM).

Bandpass filter 50 is a filter having the same function as the resolution bandwidth filter 15 shown in FIGS. 5 and 6, an internal circuit of which will be described later.

Tracking circuit 27 has a function such that the tuning frequency at which the output level of bandpass filter 50 represents its peak value is coincident with the intermediate frequency $f_0$ of mixer 14. The method of making a coincidence with the intermediate frequency $f_0$ will be discussed later.

Peak level position detector 25 detects a position at which the sweep frequency represents the peak value of the filter output from bandpass filter 50 during the mixing operation. In the mixing mode, the sweep frequency of the variable local oscillator 13 is slightly changed with respect to the reference level $l_0$ of reference signal oscillator 10 and the reference frequency signal $S_{osc}$.

The method of detecting the position of the sweep frequency at which the peak value of the filter output level becomes maximum will now be described. A center frequency $f_c$ is, for instance, set to variable local oscillator 13. Under this condition, the output of bandpass filter 50, i.e., a digital output "$M0_0$" of A/D converter 23 after the filter output is detected by detector 21, is acquired. Thereafter, the sweep frequency of variable local oscillator 13 is set to a frequency higher than the above center frequency $f_c$ by one step of the sweep dial. A comparison is made between the above digital output $M_0$ and a digital output $M_1$ of A/D converter 23, which is derived from bandpass filter 50 in the above condition. If the comparison result is ($M_1-M_0>0$), then it can be judged that an inflection top value is present at the frequency higher than the center frequency $f_c$ by one sweeping step. In the next step, the sweep frequency of local oscillator 13 is set to a frequency higher (or lower) than the center frequency $f_c$ by two steps of the dial position, and the same comparison is performed. Then, the sweep step is varied. When the output data of A/D converter 23 is equal to $M_{i+1}-M_i<0$ (i=1, 2, 3, . . . ), it can be understood that the maximum level of bandpass filter 50 is obtained at the position corresponding to the sweep frequency set at one dial position before the present dial position. It can be proven that a crystal filter of bandpass filter 50 has a single peak characteristic (will be described later). If the comparison result is $M_1-M_0$, the position of the sweep frequency at which the output level of bandpass filter 50 becomes maximum (precisely speaking, the digital signal corresponding to this position) can be detected by peak level position detector 25 in the similar manner.

In the acquisition of the peak level value, it is also possible to obtain the peak level value by selecting a first preset frequency of the variable frequency signal to be a frequency analogous to the intermediate frequency derived from mixer 14, and by gradually changing this analogous frequency. As a result, there is a particular advantage in that the peak level value can be obtained within a shorter time if it takes a long time to stabilize the local frequency (e.g., 0.1 Hz stepwise).

Figure 8:
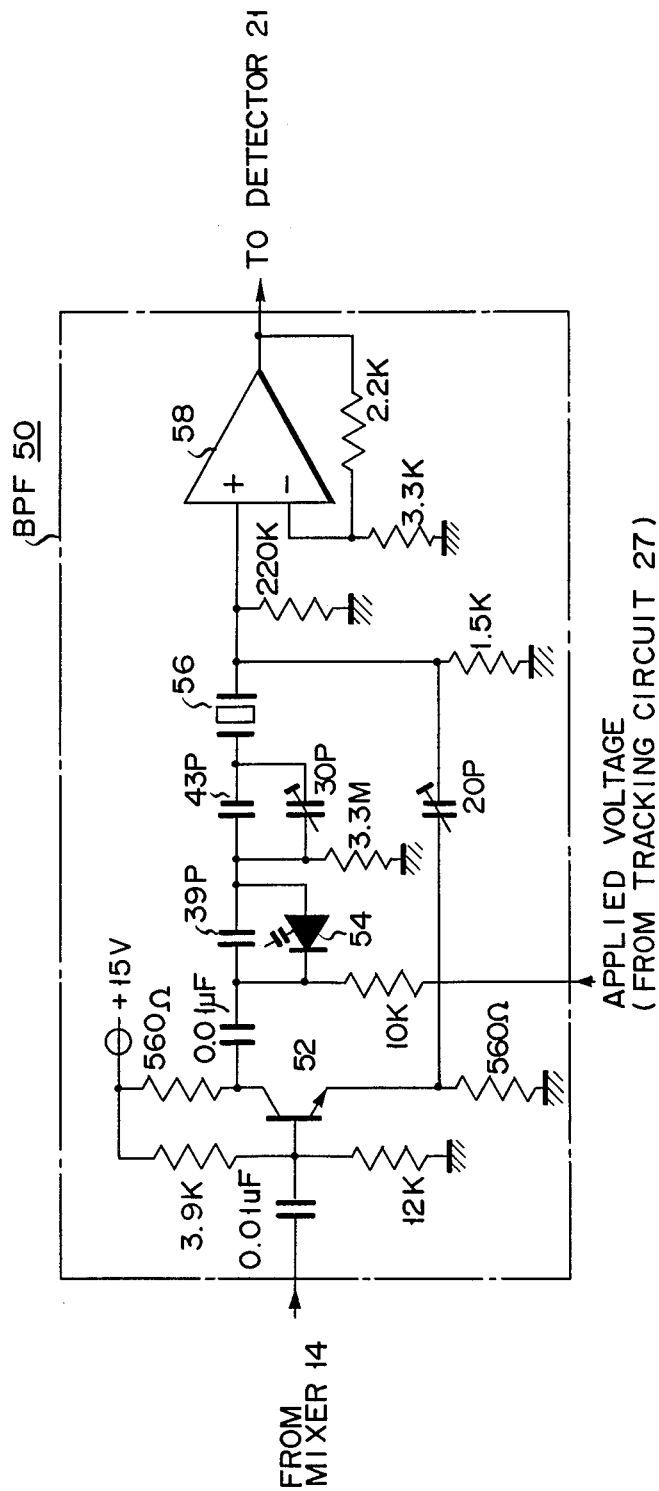
FIG. 8 is a circuit diagram of a band-pass filter according to one example of FIG. 7.

Referring to FIG. 8, a description will be made of an internal circuit of a typical bandpass filter 50.

In this bandpass filter 50, the intermediate signal from mixer 14 is amplified to a given level by an NPN transistor 52. To the collector of this transistor 52, a filter circuit, constructed by a variable capacitance diode 54 and a crystal 56, is connected. A tracking voltage, derived from tracking circuit 27 (FIG. 7), is applied to variable capacitance diode 54. Changing the reverse bias voltage (V) applied to variable capacitance diode 54 enables the peak position of the tuning frequency of filter 50 to be varied. The tuning frequency output of the filter is amplified in an operational amplifier 58 and derived as a filter output of bandpass filter 50.

The specific parts of the practical circuit above are given as follows. The transistor 52 was 2SC1010, the variable capacitance diode 54 was FC53M, and the operational amplifier 58 was LF358. The voltage of the power supply and values of the capacitors and resistors are denoted in FIG. 8.

Then, a method of acquiring the peak value of the filter will now be described. Switching means 12 is changed to reference signal oscillator 10 so as to receive reference oscillating signal $S_{ref}$ as an initial condition.

Figure 9:
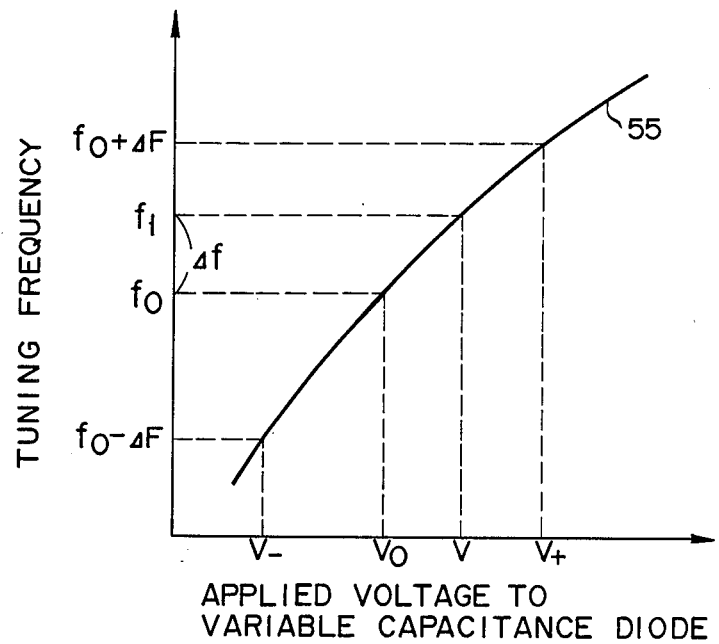
FIG. 9 is a graphic representation showing a curve of a tuning frequency versus a voltage applied to a variable capacitance diode.
Figure 10:
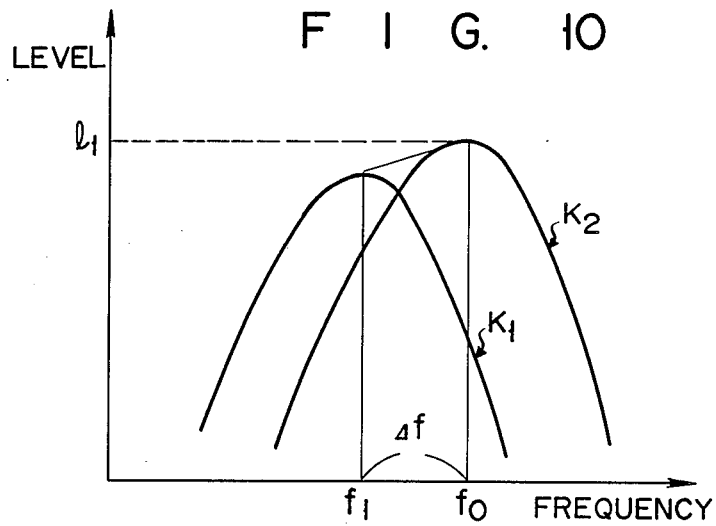
FIG. 10 is a graphic representation showing tuning conditions of the preferred embodiment of FIG. 7.

It is assumed that due to changes in an ambient temperature and aging effects and so on, the frequency corresponding to the maximum output level of the bandpass filter 50 is shifted from the intermediate frequency "$f_0$" output from mixer 14 by $\Delta f$ and becomes a frequency "$f_1$" (see FIG. 10). To solve the detuning frequency shift $\Delta f$, a curve 55 of a variable capacitance diode versus a tuning frequency as shown in FIG. 9 is obtained with respect to bandpass filter 50. A voltage "$V_0$", applied to the variable capacitance diode and corresponding to the tuning frequency $f_0$, can be obtained from the tuning curve 55 which is obtained in the above-described manner. This voltage "$V_0$" is applied to variable capacitance diode 54 in bandpass filter 50. Accordingly, the tuning frequency at which the output level of bandpass filter 50 becomes maximum is equal to "$f_0$" of the curve "$k_2$" as represented in FIG. 10. In other words, the curve "$k_1$" (corresponding to the frequency $f_1$) shown in FIG. 10 is moved to the curve "$K_2$" so that the tuning frequency of bandpass filter 50 is coincident with the intermediate frequency $f_0$ derived from mixer 14 (this curve in FIG. 10 corresponds to the curve in FIG. 3). In this case, the output level of bandpass filter 50, i.e., the filter output level which has been detected by detector 21 and digitized by A/D converter 23, is stored as a peak value in peak value memory 23. The detuning calibration for signal measuring apparatus 400 is accomplished by the above operations.

In the next step, switching means 12 is changed to the signal input side to be measured so as to receive input signal $S_M$. When the input signal $S_M$ is measured, the tuning frequency of bandpass filter 50 is coincident with the intermediate frequency $f_0$ output from mixer 14, i.e., in the tuning condition. A filter level "$l_M$" derived from A/D converter 23 is input to level correction calculating circuit 26 when the input signal $S_M$ is measured. In level correction calculating circuit 26, the peak level "$l_1$" stored in peak value memory 22 and the reference level memory 22 are read out and then the correction calculation of $l_M - (l_1 - l_0)$ is performed in level correction calculating circuit 26. A filter output level $S_{MC}$ corrected in level correction calculating circuit 26 is derived as an output of signal-measuring apparatus 400 therefrom.

As previously described above, since the signal measurement is carried out after the tuning frequency of bandpass filter 50 is coincident with the intermediate frequency $f_0$ derived from mixer 14 according to the invention, the detuning error caused by the detuning of bandpass filter 50 can be completely corrected. The filter output level $S_{MC}$ has a value where the errors occurring in the circuit path from switching means 12 to A/D converter 23 have been relatively corrected.

It should be noted that if the output level of reference signal oscillator 10 is preset to a predetermined level, for instance, 0 dBm, reference level memory 28 may be omitted.

As is easily seen from FIG. 7, detector 21, A/D converter 23, peak value memory 22, peak level position detector 25, tracking circuit 27, reference level memory 28 and level correction calculating circuit 26 are included in detuning correction means 20, shown in FIG. 5. Also, detector 21, A/D converter 23, peak level position detector 25 and tracking circuit 27 are included tracking unit (TRC) 24 of FIG. 5.

Automatic Phase Correction Means

Figure 11:
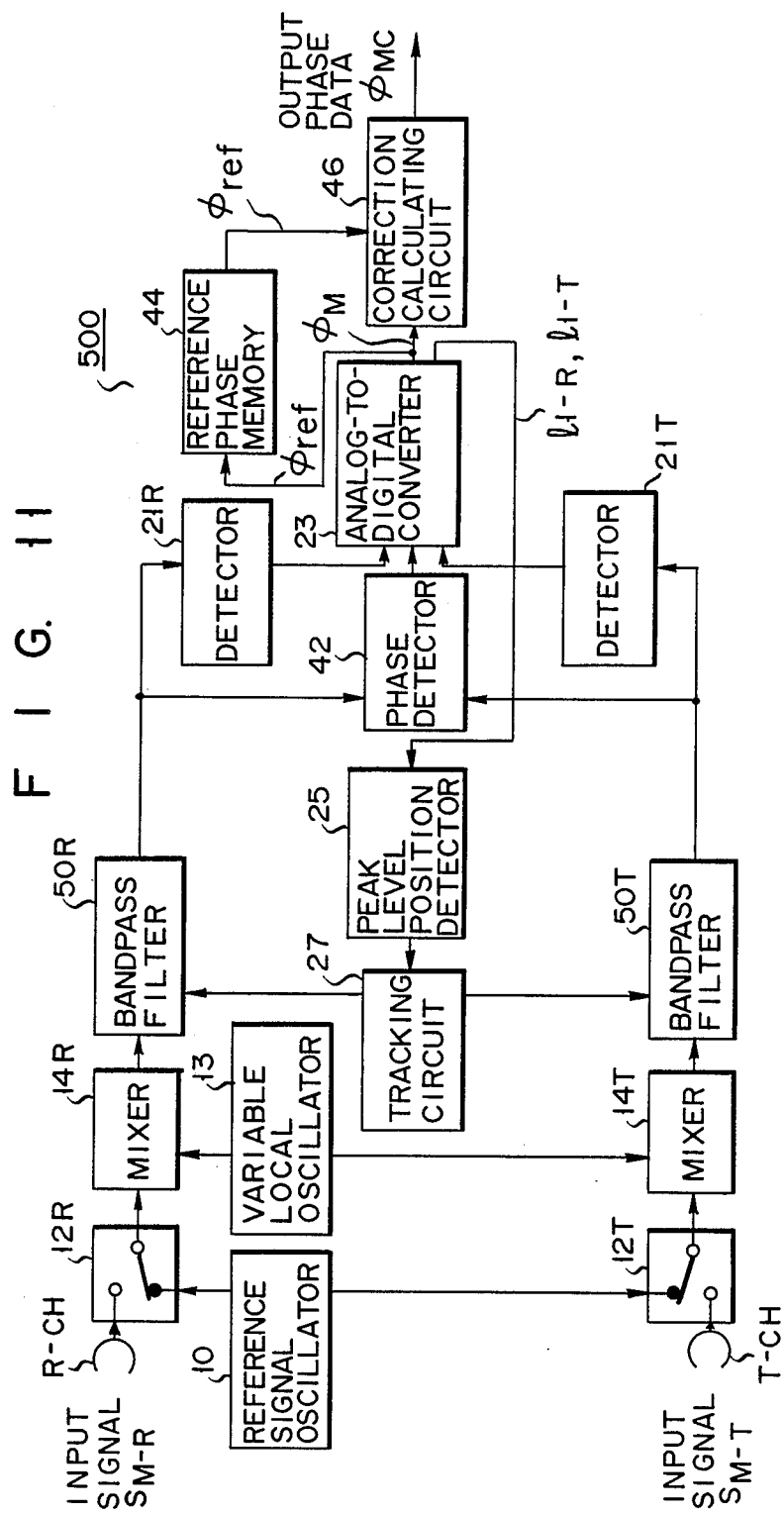
FIG. 11 is a block diagram of the measuring apparatus operated in the phase correction mode.

Referring now to FIG. 11, a detailed description will be made of a signal-measuring apparatus 500 including automatic phase-correction means as a second operation mode, according to one preferred embodiment of the invention. The signal-measuring apparatus 500 employs the principle of the basic phase-correction means as shown in FIG. 6. It should be therefore noted that the same reference numerals used in FIG. 6 indicate the same or similar circuit elements shown in FIG. 11.

Figure 6:
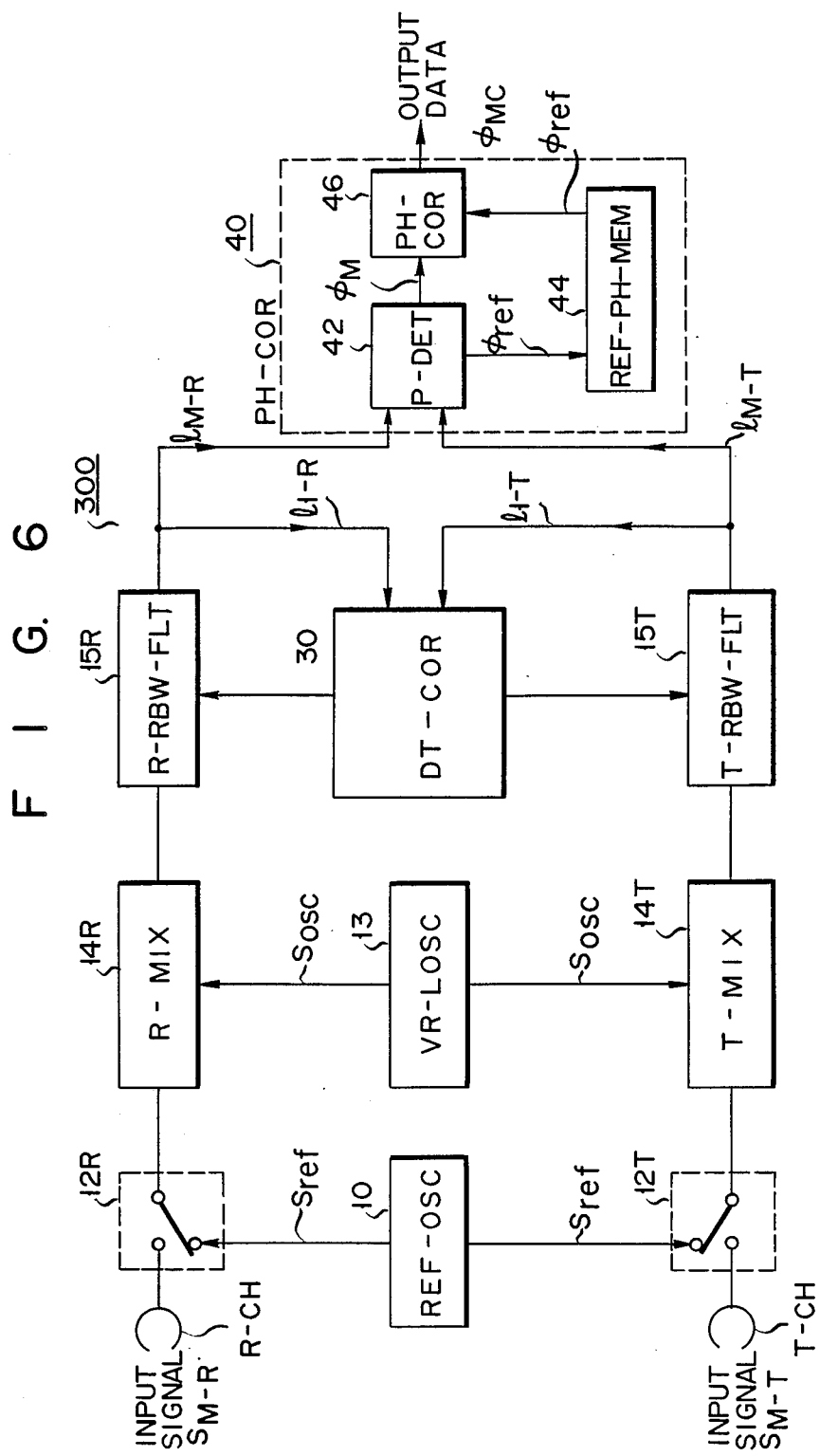
FIG. 6 is a block diagram of a basic arrangement of the measuring apparatus in the phase control mode according to the invention.

As previously explained with respect to the basic circuit arrangement in FIG. 6, after the detuning of the filter per se is first corrected in the signal-measuring apparatus 500, the phase difference between two input signals is measured. Accordingly, since the detuning correction method, described in detail with reference to FIGS. 5 and 7, has been employed in the apparatus, only a simple explanation of this correction method will now be made.

In the signal-measuring apparatus 500 shown in FIG. 11, two signal paths of the channels R-CH and T-CH are employed which are similar to the apparatus in FIG. 6. Moreover, as previously described, it should be noted that the tuning frequencies of bandpass filters 50R and 50T provided in the respective signal channels are coincident with the intermediate frequencies "$f_0$" output from the corresponding mixers 14R and 14T by means of peak level position detector 25 and tracking circuit 27. In other words, the automatic detuning correction as previously explained is performed for the filter outputs of the respective bandpass filters 50R and 50T in the signal measuring apparatus 500.

The above operation implies that the calibration for the detuning effects of filters 14R and 14T, due to temperature drift or the like, can be accomplished.

Under the above conditions, i.e., the tuning frequencies of bandpass filters 15R and 15T in both signal channels R-CH and T-CH being coincident with the respective intermediate frequency $f_0$ (namely, under the detuning correction condition), both switching means 12R of the reference channel R-CH and switching means 12T of the test channel T-CH are connected to reference signal oscillator 10 (illustrated in FIG. 11), and the oscillator signal $S_{ref}$ of reference signal oscillator 10 is supplied to the corresponding mixers 14R and 14T in the respective channels R-CH and T-CH. In this case, a phase signal obtained from phase detector 42 is digitized in A/D converter 23 and thereafter stored as a reference phase "$\phi_{ref}$" in reference phase memory 44.

In the next stage, both switching means 12R and 12T of channels R-CH and T-CH are changed to the input signal to be measured, so as to measure a phase difference between input signals $S_{M-R}$ and $S_{M-T}$ supplied to both the signal channels. It is understood that when input signals to be measured ($S_{M-R}$ and $S_{M-T}$) are measured, the detuning is corrected, namely the tuning frequencies of bandpass filters 15R and 15T are coincident with intermediate frequencies $f_0$, output from the respective mixers 14R and 14T. In phase detector 42, the filter outputs of input signals $S_{M-R}$ and $S_{M-T}$ supplied to both the signal channels are supplied and the phase difference is measured. This phase difference is supplied to correction calculating means 46 as measured phase data $\phi_M$, which is output from A/D converter 23. In correction calculating circuit 46, the reference phase $\phi_{ref}$ previously stored in reference phase memory 44, is read out, and the correction calculation of $\phi_M - \phi_{ref}$ is performed. Output phase data $\phi_{MC}$ calculated in correction calculating circuit 46, is recognized as a resultant measured value of signal measuring apparatus 500.

As the tuning frequencies of bandpass filters 15R and 15T are coincident with the respective intermediate frequencies of the corresponding mixers 14R and 14T, a particular advantage of the invention is to completely correct the detuning errors in bandpass filters 15R and 15T. In addition, when the phase correction of $\phi_M - \phi_{ref}$ is carried out, the phase errors caused by the respective circuit elements provided in the path from switching means 12R and 12T of the signal channels to the A/D converter 23 can be relatively corrected.

In summary, the center frequencies of bandpass filters 15R and 15T are shifted, due to the detuning effects of these filters, but also, errors exist in the phase difference between the input signals $S_{M-R}$ and $S_{M-T}$. Accordingly, the two types of drawbacks described above can be eliminated, and also the errors in other signal processing circuits can be relatively corrected by the automatic detuning correction means and the automatic phase correction means in signal-measuring apparatus 500, according to the preferred embodiment.

NETWORK/SPECTRUM ANALYZER

Referring to FIG. 8, a network/spectrum analyzer 800, according to the invention, employing an automatic detuning correction mode and an automatic phase correction mode will now be described.

Since this third preferred embodiment has a relationship with the above-described first embodiment (FIG. 7) and second embodiment (FIG. 11), the same reference numerals denote the same or similar circuit elements and a detailed description thereof is omitted.

Figure 12:
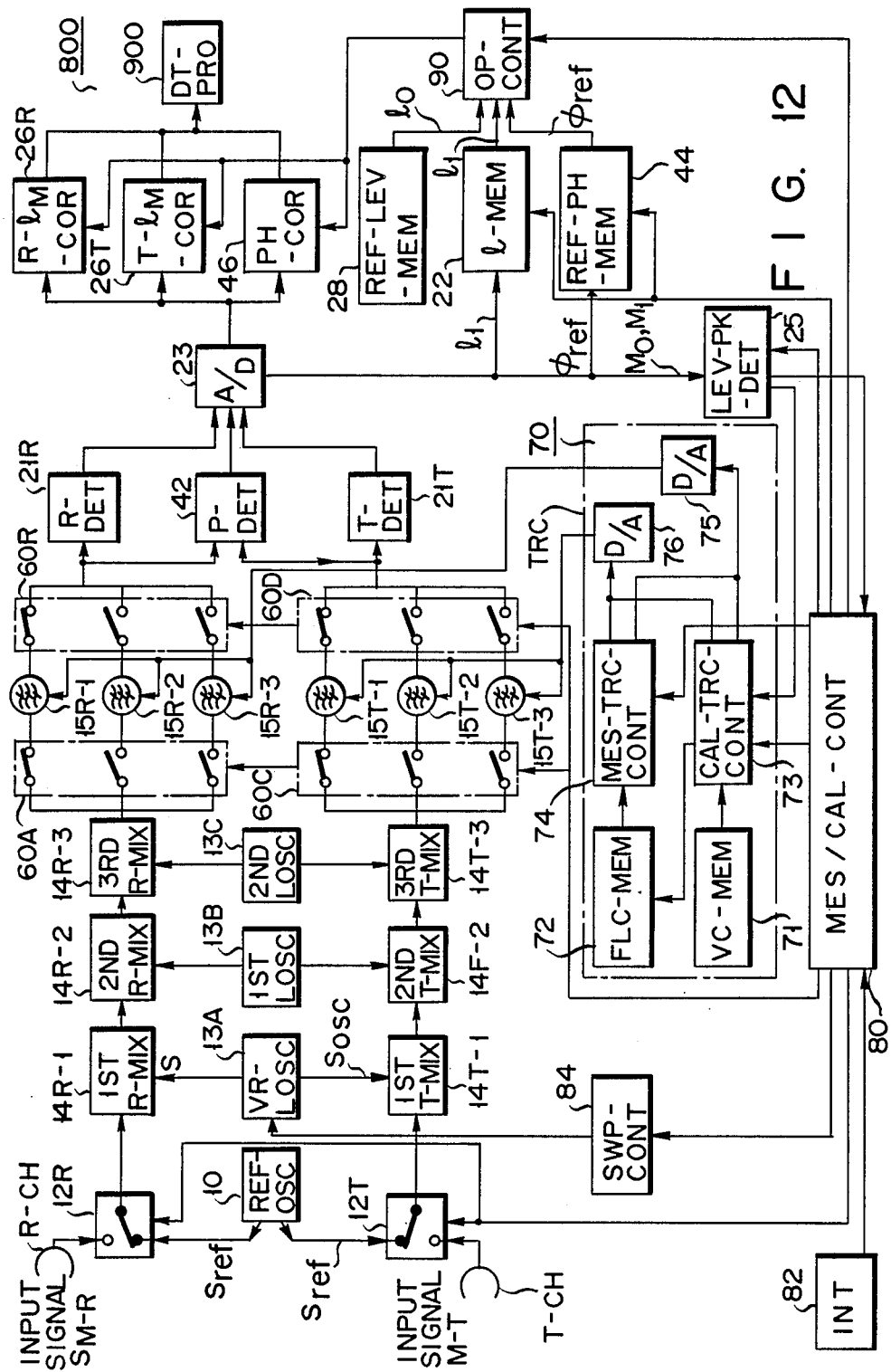
FIG. 12 is a block diagram of a network/spectrum analyzer, according to the invention, for utilizing the basic operation modes of FIGS. 5 and 6.

Network/spectrum analyzer 800 in FIG. 12 employs a triple heterodyne system. The network/spectrum analyzer includes two signal processing systems consisting of the R-channel (R-CH) and the T-channel (T-CH). The R-channel signal processing system is constructed by switching means 12R; three-staged mixers (R-MIX) 14R-1, 14R-2, 14R-3; three separate resolution bandwidth filters 15R-1, 15R-2, 15R-3; switching means 60A, 60B for selectively changing these filters; and a detector (R-DET) 21R. In addition, there are provided a reference signal oscillator (REF-OSC) 10, a variable local oscillator (VR-LOSC) 13A, and first and second fixed local oscillators (LOSC) 13B, 13C.

Since the circuit elements similar to those of the R-channel are also employed in the T-channel signal processing system, no further description will be made.

Signal-measuring apparatus 800 includes: a phase detector (P-DET) 42; an A/D converter 23; a peak value memory ($l_1$MEM) 22; a peak level position detector (LEV-PK-DET) 25; a level correction calculating circuit for the R-channel (R-$l_M$-COR) 26R; a level-correction calculating circuit for the T-channel (T-$l_m$-COR) 26T; a reference level memory (REF-LEV-MEM) 28; a reference phase memory (REF-PH-MEM) 44; a phase correction calculating circuit (PH-COR) 46 and a calculation controller (OP-CONT) 90.

Furthermore, a measuring/calibrating controller (MES/CAL-CONT) 80 is provided, to which input means (INT) 82 and a sweep signal controller (SWP-CONT) 84 are connected. Tracking means (TRC) 70 is additionally provided. The tracking means is constructed of a voltage-coded table memory (VC-MEM) 71; a filter tracking voltage-coded memory (FLC-MEM) 72; a calibration tracking controller (CAL-TRC-CONT) 73; a measuring tracking controller (MES-TRC-CONT) 74; and digital-to-analog converters 75 and 76. It should be noted that the corrected measuring data is supplied to a data processing device (DT-PRO) 900.

DETUNING CALIBRATION MODE

As is apparent from FIG. 5, there are two signal channels, consisting of the R-channel signal processing system and the T-channel signal processing system. The detuning calibration for the signal levels of the input signals $S_{M-R}$ and $S_{M-T}$ can be performed either in the R-channel, or the T-channel.

The output level "$l_0$", acquired at the reference oscillating frequency of reference signal oscillator 10, is previously stored via A/D converter 23 in reference level memory 28. A table obtained by the following method is stored in the voltage coded table memory 71 of tracking means 70. A resolution bandwidth filter 15R-1 having, for instance, a bandwidth of 3 Hz, will now be described. The signals, having 30 stepped sweeping frequencies which are varied from $(f_0 - \Delta F)$ to $(f_0 + \Delta F)$ with respect to the intermediate frequency $(f_0)$ as a center sweeping frequency, are supplied to resolution bandwidth filter 15R-1, and these signals are produced from a separate measuring device (not shown). The voltages to be applied to variable capacitance diode 54 (FIG. 8) of resolution bandwidth filter 15R-1 are changed every frequencies of 30 stepped sweeping frequencies (for example, at a step of 0.1 Hz). When each of the filter output signal levels of resolution bandwidth filter 15R-1 represents a peak value, the respective voltages being applied to variable capacitance diode 54 are read. That is to say, a curve of the voltages applied to the variable capacitance diode versus the tuning frequencies is obtained as illustrated in FIG. 9. The above-described table is formed in such a manner that each of the voltages applied to the variable capacitance diode is coded into the coded data when the sweeping frequencies are varied from $(f_0 - \Delta F)$ to $(f_0 + \Delta F)$ in 30 steps. The resultant table for resolution bandwidth filter 15R-1 is previously stored in voltage-coded table memory 71.

Such voltage-coded tables are formed in a similar way with respect to remaining resolution bandwidth filters 15R-2, 15R-3 in the R-channel, as well as resolution bandwidth filters 15T-1, 15T-2, 15T-3 in the T-channel. These tables are previously stored in voltage-coded table memory 71.

It should be noted that there is no limitation in the number of the resolution bandwidth filters employed in FIG. 12, and the respective bandwidths (e.g., 3 Hz, 30 Hz, 300 Hz) of resolution bandwidth filters 15R-1, 15R-2, 15R-3 in the R-channel correspond to those of resolution bandwidth filters 15T-1, 15T-2, 15T-3 in the T-channel.

Then, resolution bandwidth filter 15R-1 is designated via input means 82 to preset the calibration mode. Switching means 12R is connected to reference oscillator 10, so that filter changing means 60A and 60B are operated to select resolution bandwidth filter 15R-1 in the R-channel. Voltage-coded table memory 71 is accessed, via a calibration tracking controller 73, by a measuring/calibrating controller 80, so as to read the voltage code of the voltage "$V_0$" applied to the diode for the intermediate frequency "$f_0$" of resolution bandwidth filter 15R-1. The read voltage code is converted in first D/A converter 75 into an analog voltage "$V_0$", which is then applied to variable capacitance diode 54 of resolution bandwidth filter 15R-1.

On the other hand, measuring/calibrating controller 80 sends a control signal via sweep signal controller 84, to variable local oscillator 13A so that oscillating frequencies of the intermediate frequency, changing from ($f_0-\Delta F$) to ($f_0+\Delta F$) in 30 steps, are oscillated from variable local oscillator 13A, and the intermediate frequency is output from third mixer 14R-3. First, the intermediate frequency output from mixer 14R-3 becomes "$f_0$" by setting variable local oscillator 13A. At this stage, the output level "$M_0$" obtained from analog-to-digital converter 23 is detected by peak level position detector 25 and temporarily stored therein. Thereafter, the variable local oscillator 13A is set by sweep signal controlling means 84 in such a manner that the intermediate frequency derived from the mixer 14R-3 is equal to ($f_0+\Delta F/15$) advanced by one step from the above intermediate frequency. In this case, the output level "$M_1$" obtained by A/D converter 23 is input into peak level position detector 25, in which this level $M_1$ is compared with the level $M_0$ previously stored. If the comparison result is ($M_1-M_0>0$), variable local oscillator 13A is set by sweep signal controlling means 84 in such a manner that the intermediate frequency output from mixer 15R-1 is advanced by one step to ($f_0+2\Delta F/15$). At this stage, another output level $M_2$ is obtained. Then, another comparison is performed between the output level "$M_2$" and the output level "$M_1$" in peak level position detector 25. Such a signal processing method is repeated. As previously described with reference to FIGS. 7 and 11, peak level position detector 25 detects the position of the sweep frequency at which the maximum output level is obtained. This position is represented by a step number calculated from the position of the intermediate frequency 50.

Calibration tracking controller 73 accesses voltage-coded table memory 71 as an address of the step number "N" at which this output level becomes maximum, so that a code of a voltage previously stored in this table memory 71 is read out, and this voltage is to be applied to the variable capacitance diode for resolution bandwidth filter 15R-1. This voltage code is stored as a tracking code into a filter tracking voltage code memory 72.

Then, variable local oscillator 13A is set under control of measuring/calibrating controller 80 via sweep signal controlling means 84 so that the intermediate frequency output from mixer 14R-3 becomes "$f_0$". Thereafter, controller 80 delivers the control signal to measuring tracking controller 74. The tracking code is read out from filter tracking voltage-code memory 72 and subsequently converted by first D/A converter 75 into an analog signal. This analog signal is supplied to variable capacitance diode 54 included in resolution bandwidth filter 15R-1. As a result, the tuning frequency of resolution bandwidth filter 15R-1 is coincident with the intermediate frequency $f_0$ output from mixer 14R-3. Under this condition, the output level is supplied via detector 21R to A/D converter 23. The output level $l_1$, which has been digitized in A/D converter 23, is stored in filter peak value memory 22.

The calibration for resolution bandwidth filter 15R-1 is accomplished in the above manner.

By calibrating the remaining resolution bandwidth filters 15R-2 and 15R-3, the respective output levels are stored in filter tracking voltage-code memory 72 and filter peak value memory 22, and these output levels are obtained when the tracking code is coincident with the intermediate frequency $f_0$.

Figure 13:
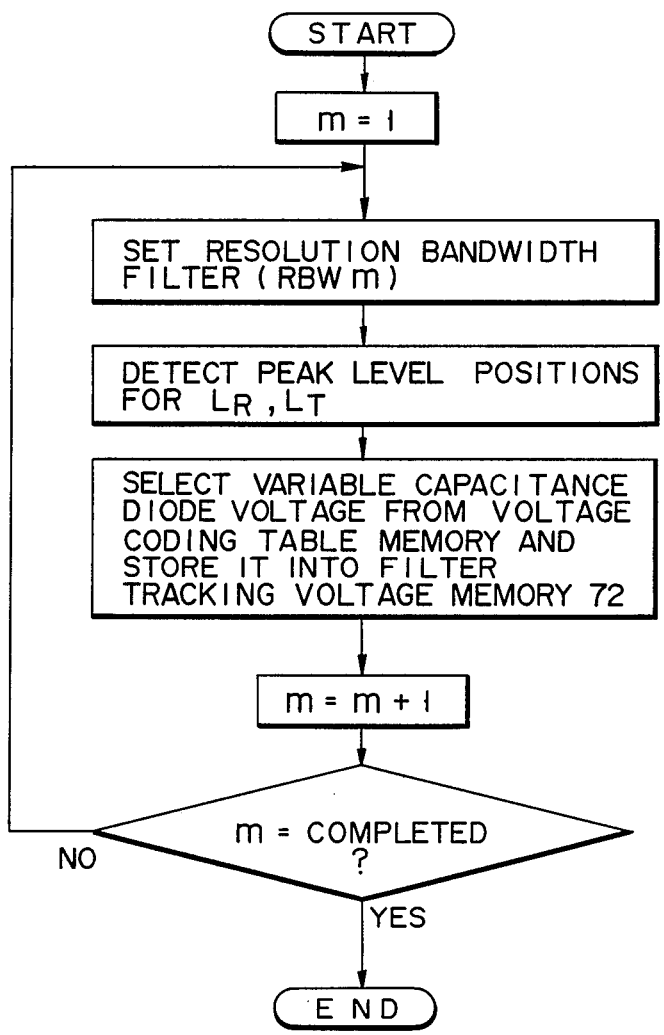

FIG. 13 is a flowchart of the tracking voltage measurement in the detuning correction mode as described above. Since the operations can be easily understood from the flowchart, no further description is made in the specification.

SIGNAL MEASUREMENT IN DETUNING CORRECTION MODE

In the next stage, the measuring mode is input through input means 82 by designating, for instance, the resolution bandwidth of $_3$ Hz and the R-signal processing channel. The measuring/calibrating controller 80 enables switching means 12R to be connected to the R-channel input for receiving the input signal to be measured $S_{M-R}$. Simultaneously, changing means 60A and 60B are operable to select a proper resolution bandwidth filter from the filters 15R-1 through 15R-3, which has the bandwidth of 3 Hz. Subsequently, the tracking of the selected resolution bandwidth filter, e.g., 15R-1 is carried out by measuring tracking controller 74. That is to say, the tracking code for this filter 15R-1 is read from filter-tracking voltage-code memory 72, and is converted in a first D/A converter 75 into an analog tracking voltage. The analog tracking voltage is applied to variable capacitance diode 56 in the resolution bandwidth filter 15R-1. Thereafter, the reference level "$l_0$" corresponding to the tracking voltage is read from reference level memory 28, and furthermore, the peak value "$l_1$" of the resolution bandwidth filter 15 is read from peak value memory 22 by an operation controller 90. These values $l_0$ and $l_1$ are transferred to an R-channel level-correction calculating circuit 26R.

Under such circumstances, the level of the input signal SM-R connected to the R-channel input is measured via a signal path defined by switching means 12R in the R-channel signal path; first to third mixers 14R-1, 14R-2, 14R-3; changing means 60A; resolution bandwidth filter 15R-1; changing means 60B; and detector 21R. The measured level of the input signal $S_{M-R}$ is digitized by A/D converter 23 and then supplied to R-channel level-correction calculating circuit 26R. Assuming that the peak level of the input signal $S_{M-R}$ just measured is "$l_M$", the correction calculation of $l_{M'}(l_1-l_0)$ is performed in R-channel level-correction calculating circuit 26R. The calculation result is supplied to an external data processing apparatus 900. That is to say, the detuning error is eliminated from this calculation result.

It should be noted that although the previous measurement was effected for the R-channel, the same detuning correction can be done for the input signal $S_{M-T}$ in the T-channel.

SIGNAL MEASUREMENT IN PHASE CORRECTION MODE

It is assumed that before the signal measurement in the phase correction mode is performed, the detuning correction is completed.

Under the control of measuring/calibrating controller 80, both switching means 12R and 12T in the R-channel and T-channel are connected to reference signal oscillator 10. The reference oscillator signal from reference signal oscillator 10 is simultaneously supplied to mixers 14R-1 and 14T-1. At this moment, a reference phase $\phi_{ref\cdot 1}$ for resolution bandwidth filters 15R-1 and 15T-1 obtained from a phase detector 42 is digitized in A/D converter 23 and stored in a reference phase memory 44 constructed by, e.g., a ROM.

It should be noted that the remaining reference phases $\phi_{ref\cdot 3}$ for resolution bandwidth filters 15R-2, 15R-3, 15T-2, and 15T-3 are previously stored in reference phase memory 44.

In the next step, the measurement mode is input via input means 82 by designating the resolution bandwidth and phase.

By measuring/calibrating controller 80, switching means 12R, 12T are connected to the corresponding R-channel input $S_{M-R}$ and T-channel input $S_{M-T}$ at the input signal side. The controller 80 further controls changing means 60A/60B and 60C/60D in such a manner that a pair of resolution bandwidth filters having bandwidths corresponding to the designated resolution bandwidths are selected. Subsequently, the tracking operations of the resolution bandwidth filters selected from the R-channel and T-channel in a pair form are effected by the tracking controller 74. That is to say, the tracking codes relating to the selected resolution bandwidth filters are successively read from filter-tracking voltage-code memory 72. The read tracking codes are converted by first D/A converter 75 into analog voltages. Thus, the analog tracking voltages are applied to the respective variable capacitance diodes (not shown) in the resolution bandwidth filter. If the reference phase relating to said one pair of resolution bandwidth filters, e.g., a pair of filters 15R-1 and 15T-1, has been selected, the reference phase $\phi_{ref\cdot 1}$ is read by calculating controller 90 and thereafter transferred to phase correction calculating circuit 46.

Under these conditions, the phase difference between the input signals $S_{M-R}$ and $S_{M-T}$ supplied to the respective R-channel input and T-channel input, is measured in the R and T-signal processing channels. The resultant phase difference between the input signals $S_{M-R}$ and $S_{M-T}$ is digitized in A/D converter 23 and transferred to phase correction calculating circuit 46. Assuming that the present phase shift between the input signals $S_{M-R}$ and $S_{M-T}$ is $\phi_M$, the correction calculation of $(\phi_M - \phi_{ref\cdot 1})$ is performed in phase correction calculating circuit 46, and the calculation result is supplied to external data processing device 400.

Since the same signal measurement can be applied to other pairs of the resolution bandwidth filter, no detailed explanation is made in the specification.

A series of operations in the detuning correction mode and in the phase correction mode is illustrated in a flowchart of FIG. 14.

It should be noted that the symbols, e.g., "RBWm" used in the flowchart represent a general filter, and also, no correction data memory is disclosed in FIG. 12.

OVERALL OPERATION

Overall operation of network/spectrum analyzer 800 according to a preferred embodiment will now be summarized.

Firstly, the detuning of resolution bandwidth filters 15R-1 through 15R-3, as well as 15T-1 to 15T-3 in the respective signal processing channels R-CH and T-CH is corrected.

Secondly, when the input signal level is, for instance, measured, either one of the signal processing channels is selected, and either input signal $S_{M-R}$, or input signal $S_{M-T}$ is selectively input therein. The filter output "$1_M$" of this input signal is corrected with respect to the detuning error by the peak value "$l_1$", which has been previously obtained in level correction circuit 26R, 26T, and by the reference level "$l_0$", if required. As a result, the measurement value $S_{MC}$ containing no detuning error is obtained.

Moreover, in case of the phase difference measurement, the phase difference "$\phi_M$" is obtained by employing two signal processing channels. This phase difference $\phi_M$ is phase-corrected by utilizing the reference phase difference $\phi_{ref}$. Accordingly, true phase difference data $\phi_{MC}$ can be obtained.

As previously described in detail, the level of the input signal is measured under the condition that the intermediate frequency of the practical resolution bandwidth filter is automatically coincident with its formal intermediate frequency, according to the invention. The measured value and the correction value of the resolution bandwidth filter previously stored are calculated to automatically perform the level correction. Accordingly, the correct level measurement can be achieved. Since the calibration value and the measuring value are obtained in the identical circuit and, therefore, the errors in the respective circuits can be relatively corrected, the precise level measurement can be done with higher stability.

Moreover, the phase difference between the input signals can be always measured as a true value.

There are particular advantages, in that resolution bandwidth filters having various bandwidths can be employed, and the error-corrected measurement value can be easily obtained.

In addition, since the reference signal oscillator is employed inside the measuring apparatus, and the calibration is controlled by a microprocessor (not shown), the automatic calibration can be performed within the measuring apparatus. Consequently, an operator is only required to push a button of the measuring apparatus once, so that the above calibration can be automatically performed. Alternatively, an external controller may be coupled, e.g., via a GP-IB bus (not shown), to the measuring apparatus so as to transmit only one command thereto for performing automatic calibration. Accordingly, instead of employing a complex calibration procedure for the conventional measuring apparatus by use of an external standard measuring apparatus, the calibration according to the invention can be very simply realized.

It is evident to those skilled in the art that other modifications can be easily conceived without departing from the technical spirit and scope of the present invention.

In the network/spectrum analyzer, there were, for instance, two signal processing systems; but more signal processing systems may be employed.

We claim:

1. A heterodyne type signal measuring method comprising the steps of:
   generating a reference signal having a reference frequency and a predetermined signal level;
   generating a variable frequency signal whose oscillating frequency is varied within a given range;
   producing a signal having an intermediate frequency by receiving either the reference signal, or a signal to be measured so as to be heterodyne-mixed with said variable frequency signal;

resolution-bandwidth-filtering the intermediate frequency signal;

acquiring a peak level value in said bandwidth-filtering step upon receipt of said reference signal while the frequency of said variable frequency signal is varied;

correcting the detuning occurring in said filtering step based upon said peak level value; and calculating a level of said input signal which has been bandwidth-filtered when said input signal to be measured is received so as to correct a level error caused by the detuning, based upon said peak level value, whereby the level of said input signal can be measured under the correct level by correcting the detuning error occurring at said filtering step when the level of said input signal is measured.

2. A method as claimed in claim 1, wherein said frequency varying step is accomplished by a frequency synthesizing method.

3. A method as claimed in claim 1, wherein said resolution-bandwidth-filtering step is accomplished by a bandpass filter.

4. A method as claimed in claim 1, wherein said filtering step is accomplished by a bandpass filter having a variable capacitance element and a crystal of a single peak characteristic.

5. A method as claimed in claim 1, further comprising a step of storing as a reference level the signal level output from said filtering step when said reference signal is received.

6. A method as claimed in claim 1, wherein in said peak level value acquiring step, an initial preset frequency of said variable frequency signal is selected to be a frequency analogous to the intermediate frequency obtained in said heterodyne mixing step, and thereafter the peak level value is acquired by gradually changing said analogous frequency.

7. A heterodyne type signal-measuring apparatus comprising:

means for generating a reference signal having a reference frequency and a predetermined signal level;

means for generating a variable frequency signal whose oscillating frequency is varied within a given range;

means for producing a signal having an intermediate frequency by receiving either the reference signal, or a signal to be measured so as to be heterodyne-mixed with said variable frequency signal;

means for resolution-bandwidth-filtering said intermediate frequency signal;

means for acquiring a peak level value from the output of said resolution-bandwidth-filtering means upon receipt of said reference signal while the frequency of said variable frequency signal is varied;

tracking means for making a tuning frequency of said filtering means coincident with said intermediate frequency based upon said peak level value; and means for calculating the level of the input signal which has been filtered when said input signal to be measured is received so as to correct a level error caused by the detuning, based upon said peak level value, whereby the level of said input signal can be measured under the correct level by correcting the detuning error occurring in said filtering means when the level of said input signal is measured.

8. An apparatus as claimed in claim 7, wherein said variable frequency signal-generating means is a frequency-synthesized oscillator.

9. An apparatus as claimed in claim 7, wherein said resolution-bandwidth-filtering means is a bandpass filter.

10. An apparatus as claimed in claim 7, wherein said filtering means is a bandpass filter having a variable capacitance element and a crystal of a single peak characteristic.

11. An apparatus as claimed in claim 7, further comprising means for storing as a reference level the signal level output from said filtering means when said reference signal is received.

12. A heterodyne type signal measuring method, wherein at least a first signal processing channel for processing a first measured signal as a reference signal, and a second signal processing channel for processing a second measured signal having a phase difference to be measured are provided to measure the phase difference between said first and second signals, said signal measuring method comprising the steps of:

generating a reference signal having a reference frequency and a predetermined signal level;

generating a variable frequency signal whose oscillating frequency is varied within a given range;

producing signals having first and second intermediate frequencies by receiving either the first signal, or the second signal so as to be heterodyne-mixed with said variable frequency signal;

resolution-bandwidth-filtering the first intermediate frequency;

resolution-bandwidth-filtering the second intermediate frequency;

acquiring first and second peak level values in said first and second bandwidth-filtering steps upon receipt of said reference signal while the frequency of said variable frequency signal is varied;

correcting the detuning occurring in said first and second filtering steps based upon said first and second peak level values;

detecting a phase difference between the reference signals passing through said first and second filtering steps when said reference signal is received and said first and second peak level values are obtained;

storing said phase difference in the detecting step as a reference phase difference; and phase-correcting a phase difference between said first and second signals which have passed through said first and second filtering steps, based upon said reference phase difference, upon receipt of said first and second signals, whereby said phase difference between said first and second signals to be measured can be automatically corrected.

13. A method as claimed in claim 12, wherein said frequency varying step is accomplished by a frequency synthesizing method.

14. A method as claimed in claim 12, wherein said resolution-bandwidth-filtering step is accomplished by a bandpass filter.

15. A method as claimed in claim 12, wherein said filtering step is accomplished by a bandpass filter having a variable capacitance element and a crystal of a single peak characteristic.

16. A method as claimed in claim 12, further comprising a step of storing as a reference level the signal level output from said filtering step when said reference signal is received.

17. A method as claimed in claim 12, wherein in said peak level value-acquiring step, an initial preset frequency of said variable frequency signal is selected to be a frequency analogous to the intermediate frequency obtained in said heterodyne mixing step, and thereafter the peak level value is acquired by gradually changing said analogous frequency.

18. A heterodyne type signal-measuring apparatus wherein at least a first signal processing channel for processing a first measured signal as a reference signal, and a second signal processing channel for processing a second measured signal having a phase difference to be measured are provided to measure the phase difference between said first and second signals, said signal-measuring apparatus comprising:

- means for generating a reference signal having a reference frequency and a predetermined signal level;
- means for generating a variable frequency signal whose oscillating frequency is varied within a given range;
- means for producing signals having first and second intermediate frequencies by receiving either the first signal, or the second signal so as to be heterodynemixed with said variable frequency signal;
- means for resolution-bandwidth-filtering the first intermediate frequency;
- means for resolution-bandwidth-filtering the second intermediate frequency;
- means for acquiring first and second peak level values in said first and second bandwidth-filtering means upon receipt of said reference signal while the frequency of said variable frequency signal is varied;
- means for correcting the detuning occurring in said first and second filtering means based upon said first and second peak level values;
- means for detecting a phase difference between the reference signals passing through said first and second filtering means when said reference signal is received and said first and second peak level values are ob- tained;
- means for storing said phase difference in the detecting means as a reference phase difference; and
- means for phase-correcting a phase difference between said first and second signals which have passed through said first and second filtering means, based upon said reference phase difference, upon receipt of said first and second signals, whereby said phase difference between said first and second signals to be measured can be automatically corrected.

19. An apparatus as claimed in claim 18, wherein said variable frequency signal-generating means is a frequency synthesized oscillator.

20. An apparatus as claimed in claim 18, wherein said resolution-bandwidth-filtering means is a bandpass filter.

21. An apparatus as claimed in claim 18, wherein said filtering means is a bandpass filter having a variable capacitance element and a crystal of a single peak characteristic.

22. An apparatus as claimed in claim 18, further comprising means for storing as a reference level the signal level output from said filtering means when said reference signal is received.

23. A signal-measuring apparatus as claimed in claim 18, wherein said variable frequency signal generating means is arranged by a three-staged local frequency signal generator, said first and second heterodyne mixing means are respectively constructed by a three-staged mixer, and furthermore, said first and second resolution-bandwidth-filtering means are respectively arranged by three pairs of bandpass filters having three different bandwidths, thereby constructing a network/spectrum analyzer.

* * * * *